United States Patent
Choi et al.

(10) Patent No.: US 9,040,344 B2
(45) Date of Patent: May 26, 2015

(54) METHOD FOR FABRICATING ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/984,090

(22) PCT Filed: Dec. 13, 2012

(86) PCT No.: PCT/CN2012/086597
§ 371 (c)(1),
(2) Date: Aug. 7, 2013

(87) PCT Pub. No.: WO2014/012334
PCT Pub. Date: Jan. 23, 2014

(65) Prior Publication Data
US 2014/0167031 A1    Jun. 19, 2014

(30) Foreign Application Priority Data
Jul. 20, 2012 (CN) .......................... 2012 1 0254735

(51) Int. Cl.
*H01L 21/02* (2006.01)
*H01L 27/12* (2006.01)
*H01L 29/786* (2006.01)

(52) U.S. Cl.
CPC ...... *H01L 29/7869* (2013.01); *H01L 21/02565*
(2013.01); *H01L 21/02664* (2013.01); *H01L 27/1203* (2013.01); *H01L 27/1225* (2013.01)

(58) Field of Classification Search
CPC ................... H01L 21/76823; H01L 21/76838; H01L 21/76867; H01L 21/02565; H01L 21/02664; H01L 29/7869; H01L 27/1203
USPC ............. 438/104, 652, 658, 660, 666; 257/43
See application file for complete search history.

(56) References Cited

U.S. PATENT DOCUMENTS

2004/0027525 A1 *  2/2004  Itakura et al. .................. 349/141
2004/0125280 A1 *  7/2004  Kim et al. ...................... 349/110

(Continued)

FOREIGN PATENT DOCUMENTS

| CN | 1459657 A | 12/2003 |
| CN | 1506737 A |  6/2004 |

(Continued)

OTHER PUBLICATIONS

International Search Report mailed Apr. 25, 2013; PCT/CN2012/086597.

(Continued)

*Primary Examiner* — Whitney T Moore
(74) *Attorney, Agent, or Firm* — Ladas & Parry LLP

(57) ABSTRACT

A method for fabricating array substrate, an array substrate and a display device. The method for fabricating the array substrate comprises forming a thin film transistor, a first transparent electrode (14) and a second transparent electrode (19), wherein a multi dimensional electric field is created by the first transparent electrode (17) and the second transparent electrode (19), wherein forming the first transparent electrode (17) comprises: forming a metal oxide film presenting semiconductor properties; forming the first transparent electrode (17) by subjecting a portion of the metal oxide film to metallization treatment, and forming a semiconductor active layer (141) from a portion which is not subjected to the metallization treatment.

11 Claims, 5 Drawing Sheets

(56) References Cited

U.S. PATENT DOCUMENTS

| | | | |
|---|---|---|---|
| 2011/0017989 A1* | 1/2011 | Chen et al. | 257/43 |
| 2011/0291094 A1* | 12/2011 | Cheng et al. | 257/59 |
| 2012/0181557 A1 | 7/2012 | Kim et al. | |
| 2012/0182490 A1 | 7/2012 | Kim et al. | |
| 2014/0167031 A1 | 6/2014 | Choi et al. | |

FOREIGN PATENT DOCUMENTS

| | | | |
|---|---|---|---|
| CN | 102156368 A | 8/2011 | |
| CN | 102156369 A | 8/2011 | |
| CN | 102157564 A | 8/2011 | |
| CN | 102315167 A | 1/2012 | |
| CN | 202126557 U | 1/2012 | |
| CN | 102790012 A | 11/2012 | |
| KR | 20040050235 A | 6/2004 | |

OTHER PUBLICATIONS

First Chinese Office Action dated Dec. 24, 2013; Appln. No. 201210254735.8.
Second Chinese Office Action dated Mar. 17, 2014; Appln. No. 201210254735.8.
Korean Examination Opinion Appln. No. 10-2013-7011943; Issued Aug. 31, 2014.
Fourth Chinese Office Action Appln. No. 2012102547358; Issued Sep. 17, 2014.
Third Chinese Office Action dated Jun. 13, 2014; Appln. No. 201210254735.8.
International Preliminary Report on Patentability Appln. No. PCT/CN2012/086597; Dated Jan. 20, 2015.
Chinese Rejection Decision dated Feb. 3, 2015; Appln. No. 201210254735.8.

* cited by examiner

METHOD FOR FABRICATING ARRAY SUBSTRATE, ARRAY SUBSTRATE AND DISPLAY DEVICE

FIELD OF THE INVENTION

Embodiments of the present invention relate to a method for fabricating array substrate, an array substrate and a display device.

BACKGROUND

Liquid crystal display is currently a common flat display device, wherein Thin Film Transistor Liquid Crystal Display (abbreviated as TFT-LCD) is a mainstream product for the liquid crystal display.

Advanced Super Dimension Switch (referred to as AD-SDS, abbreviated as ADS) based TFT-LCD becomes widely used due to its characters of low power consumption, wide viewing angle and the like. ADS technology forms a multi-dimensional electric field mainly through an electric field generated by fringes of a slit electrode within a same plane and an electric field generated between a slit electrode layer and a plate-shaped electrode layer so that liquid crystal molecules in all orientations between the slit electrodes and directly above the electrodes in a liquid crystal cell can be rotated, thus a work efficiency of the liquid crystal may be improved and the light transmission efficiency may be increased. The AD-SDS technology can improve the image quality of the TFT-LCD products, and has advantages of high resolution, high transmittance, wide viewing angle, high aspect ratio, low chromatic aberration, being free of push Mura and the like.

As a common electrode is also formed on an ASD type TFT-LCD array substrate, there is a need for an additional patterning process to form the common electrode in the process for fabricating the ASD type TFT-LCD array substrate.

Currently, there generally need several patterning processes during the fabrication of the ASD type TFT-LCD array substrate, and each patterning process further comprises a film forming process, an exposing process, a developing process, an etching process and a stripping process and the like, respectively. Therefore, to reduce the time for patterning processes means that the fabrication cost can be reduced.

A method for fabricating ASD type TFT-LCD array substrate through six patterning processes is disclosed in the prior art (shown in FIG. 1), the method comprises:

Step 1, depositing a first metal film, to form gate lines, a gate electrode 11 and a common electrode 12 by a first patterning process.

Step 2, depositing a first insulating film, a semiconductor film, a doped semiconductor film, to form a gate insulating layer 13, a semiconductor active layer 14 (composed of semiconductor layer and semiconductor doped layer) by a second patterning process.

Step 3, depositing a first transparent conductive film, to form a plate-shape pixel electrode 14' by a third patterning process.

Step 4, depositing a second metal film, to form a source electrode 16, a drain electrode 17 and data lines by a fourth patterning process.

Step 5, depositing a second insulating film to form a passivation layer 18, forming a through hole passing through the passivation layer 18 and the gate insulating layer 13 by a fifth patterning process, to expose common electrode lines 12.

Step 6, depositing a second transparent conductive film, to form a common electrode 19 having slit by a six patterning process, the common electrode 19 is electrically connected to the common electrode lines 12 via the through hole formed in step 5.

Such method needs six patterning processes, and the fabrication cost is still high. In order to enhance market competitiveness, improve market share, there is a need for further decreasing times of the patterning processes during the fabrication of the array substrate.

SUMMARY

Embodiments of the present invention provide a method for fabricating an array substrate, an array substrate, and a display device, to decrease times of the patterning processes during the fabrication of the array substrate, and reduce the production cost.

To achieve the above-mentioned purpose, the embodiments of the present invention employ the following technical solutions.

According to an aspect of the embodiment of the invention, a method for fabricating an array substrate comprises forming a thin film transistor, a first transparent electrode and a second transparent electrode, wherein a multi dimensional electric field is created by the first transparent electrode and the second transparent electrode, wherein, forming the first transparent electrode comprises:

forming a metal oxide film presenting semiconductor properties;

forming the first transparent electrode by subjecting a portion of the metal oxide film to metallization treatment, and forming a semiconductor active layer from a portion which is not subjected to the metallization treatment.

In an embodiment, forming the thin film transistor, the first transparent electrode and the second transparent electrode comprises: sequentially forming the metal oxide film and an etching barrier layer film on the substrate having a gate line, a gate electrode and a gate insulating layer formed thereon; forming an etching barrier layer covering a TFT channel region by treating the etching barrier layer film with patterning process; subjecting the metal oxide film not covered by the etching barrier layer to metallization treatment, to form a metal oxide film having conductor properties; forming the semiconductor active layer from the portion of the metal oxide film that is covered by the etching barrier layer and is not subjected to the metallization treatment; forming the first transparent electrode and a source connecting electrode, a drain connecting electrode connected to the semiconductor active layer by treating the metal oxide film having conductor properties with patterning process; forming a source electrode, a drain electrode, a data line, a passivation layer and the second transparent electrode on the substrate having the semiconductor active layer, the etching barrier layer and the first transparent electrode formed thereon, wherein, the source electrode is electrically connected to the source connecting electrode, the drain electrode is electrically connected to the drain connecting electrode.

An embodiment further comprises forming the gate line, the gate electrode and a common electrode line on the substrate and forming a gate insulating layer on the substrate, the gate line, the gate electrode and the common electrode line, prior to sequentially forming the metal oxide film and the etching barrier layer film on the substrate having the gate line, the gate electrode and the gate insulating layer formed thereon; forming the source electrode, the drain electrode, the data line, the passivation layer and the second transparent electrode on the substrate having the semiconductor active layer, the etching barrier layer and the first transparent electrode formed thereon comprises: forming the data line, the source electrode, and the drain electrode electrically connected to the first transparent electrode on the substrate having the semiconductor active layer, the etching barrier layer and the first transparent electrode formed thereon, forming the passivation layer containing a first through hole, the first through hole passing through the passivation layer and the gate insulating layer so as to expose the common electrode line; and forming the second transparent electrode on the passivation layer, the second transparent electrode being electrically connected to the common electrode line via the first through hole.

An embodiment further comprises forming the gate line, the gate electrode, a common electrode line and a gate insulating layer on the substrate, and forming a second through hole on the gate insulating layer for connecting the first transparent electrode with the common electrode lines, prior to sequentially forming the metal oxide film and the etching barrier layer film on the substrate having the gate line, the gate electrode and the gate insulating layer formed thereon; forming the source electrode, the drain electrode, the data line, the passivation layer and the second transparent electrode on the substrate having the semiconductor active layer, the etching barrier layer and the first transparent electrode formed thereon comprises: forming the source electrode, the drain electrode, and the data line on the substrate having the semiconductor active layer, the etching barrier layer and the first transparent electrode formed thereon; forming the passivation layer containing a third through hole, the third through hole passing through the passivation layer so as to expose the drain electrode; and forming the second transparent electrode on the passivation layer, the second transparent electrode being electrically connected to the drain electrode via the third through hole.

In an embodiment, forming the first transparent electrode by subjecting a portion of the metal oxide film to metallization treatment comprises: forming the first transparent electrode by subjecting a portion of the metal oxide film to metallization treatment by plasma process or annealing process.

In an embodiment, the first transparent electrode is a pixel electrode or a common electrode.

In an embodiment, the metal oxide film is a transparent metal oxide material presenting semiconductor properties. For example, the metal oxide material may be InGaZnO, InGaO, ITZO, AlZnO.

According to another aspect of the present embodiment, an array substrate fabricated from the above method is provided.

According to another aspect of the present embodiment, a display device comprising the above mentioned array substrate is provided.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
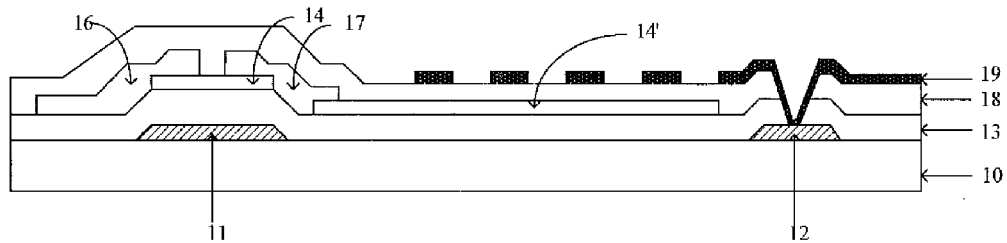
FIG. 1 is a schematic structural view of a prior art array substrate.

Description of the legend in the drawings: 1—gate line; 2—data lines; 10—substrate, 11—gate electrode; 12—common electrode line; 13—gate insulating layer, 131—second through hole; 141—semiconductor active layer; 142—source connecting electrode, 143—drain connecting electrode, 14—first transparent electrode, 140—metal oxide film; 15—etching barrier layer, 150—etching barrier layer film; 16—source electrode; 17—drain electrode; 18—passivation layer, 181—first through hole, 182—third through hole; 19—second transparent electrode; 20—first photoresist, 21—second photoresist; 22—third photoresist.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terminology or scientific terminology used herein should have the general meanings understood by those skills in the art to which the invention belongs. The "first", "second" and similar words used in the present invention application specification and claims do not mean any sequence, amount or importance, but are merely used to distinguish different components. Likewise, "a" or "an" or similar words do not mean the limitation to amount, instead, it refers to at least one. "Comprise" or "comprising" or similar words is intended to mean the elements or objects appearing before the "comprise" or "comprising" cover those listed after the "comprise" or "comprising", or are equivalent thereto, while other elements or objects are not exclusive. "Connecting" or "connected" and similar words are not limited to the physical or mechanical connection, but may comprise electrical connection, no matter directly or indirectly. "over", "under", "left", "right" and the like are merely used to denote the relative location relationship, when the absolute location of the subject to be described is changed, the relative location relationship may also be changed correspondingly.

First Embodiment

A method for fabricating an array substrate provided in the present embodiment, comprising fabricating processes for a thin film transistor, a first transparent electrode and a second transparent electrode. A multi-dimensional electric field is created by the first transparent electrode and the second transparent electrode. Wherein, the fabricating process for the first transparent electrode comprises:

Step 1, forming a metal oxide film presenting semiconductor properties.

Step 2, forming a first transparent electrode by subjecting a portion of the metal oxide film to metallization treatment, a semiconductor active layer is formed by a portion which is not subjected to the metallization treatment.

Further, forming a first transparent electrode by subjecting a portion of the metal oxide film to metallization treatment in step 2 may comprises: forming the first transparent electrode by subjecting a portion of the metal oxide film to metallization treatment by plasma process or annealing process.

Further, in the present example, the first transparent electrode is a pixel electrode; alternatively, the first transparent electrode is a common electrode.

In the method for fabricating an array substrate provided in the present embodiment, a portion of the metal oxide film is subjected to metallization treatment to present conductor properties so as to form the first transparent electrode, a portion which is not subjected to metallization treatment presents semiconductor properties to form the semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost.

Second Embodiment

Figure 2:
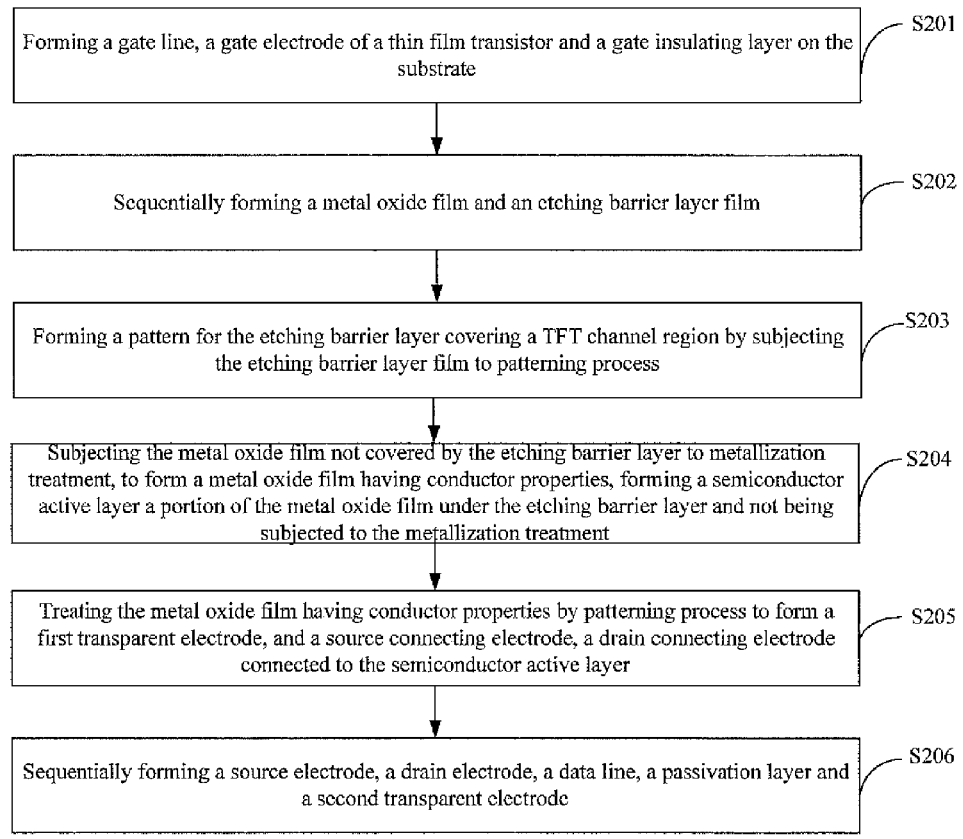
FIG. 2 is a flowchart for the method for fabricating an array substrate provided in an embodiment of the present invention.

A method for fabricating an array substrate provided in the present embodiment, as shown in FIG. 2, comprises:

S201, forming a gate line, a gate electrode of a thin film transistor and a gate insulating layer on the substrate.

Figure 3:
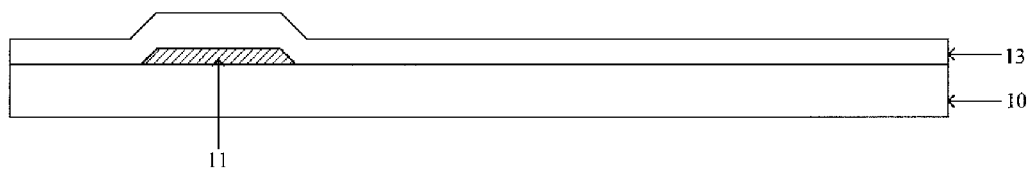
FIG. 3 is a first schematic view of an array substrate provided in a second embodiment of the present invention.

Exemplarily, referring to FIG. 3, firstly, a first metal film is formed on a substrate 10 (such as glass substrate or quartz substrate) by using plasma enhanced chemical vapor deposition (PECVD), magnetron sputter, thermal evaporation or other film forming methods. Wherein, the first metal film may be a single film formed of metals such as molybdenum, aluminum, aluminum rubidium alloy, tungsten, chromium, copper etc., or may be a multi-layer film formed by a multi-layered deposition of the above metals. After a photoresist layer is coated on the first metal film, patterns for a gate electrode 11 as shown in FIG. 3 and a gate line which are not shown in FIG. 3 are formed by patterning processing treatment such as exposure, development, etching and stripping, and the like using a mask. Then, a gate insulating layer 13 is formed on the gate line, the gate electrode 11 and the substrate 10 by method such as chemical vapor deposition or evaporation deposition, and the like.

S202, sequentially forming a metal oxide film and an etching barrier layer film on the substrate having the gate line, the gate electrode and the gate insulating layer formed thereon.

Figure 4:
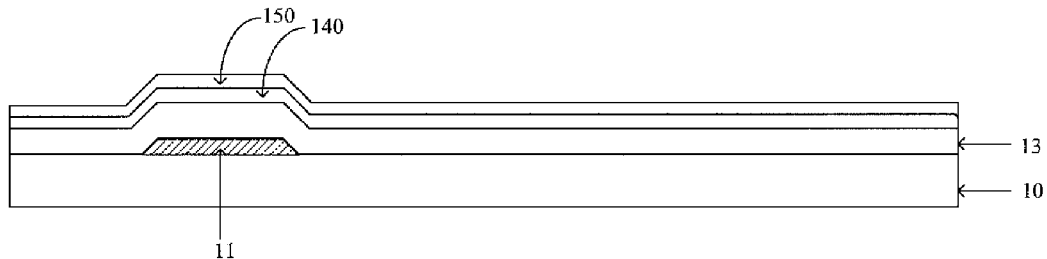
FIG. 4 is a second schematic view of the array substrate provided in the second embodiment of the present invention.

Exemplarily, as shown in FIG. 4, a metal oxide film 140 and an etching barrier layer film 150 are sequentially formed on the substrate 10 having the gate line, the gate electrode 11 and the gate insulating layer 13 formed thereon. For example, the metal oxide film 140 and the etching barrier layer film 150 may be formed by using method such as magnetron sputtering, thermal evaporation or chemical vapor deposition and the like. For example, the metal oxide film 140 may use transparent metal oxide materials presenting semiconductor properties, e.g., it may be transparent metal oxide materials such as InGaZnO, InGaO, ITZO, AlZnO and the like; the etching barrier layer film 150 may be materials such as condense silicon nitride, silicon oxide, silicon oxynitride and the like.

S203, forming a pattern for the etching barrier layer covering a TFT channel region by subjecting the etching barrier layer film to patterning process.

Figure 5:
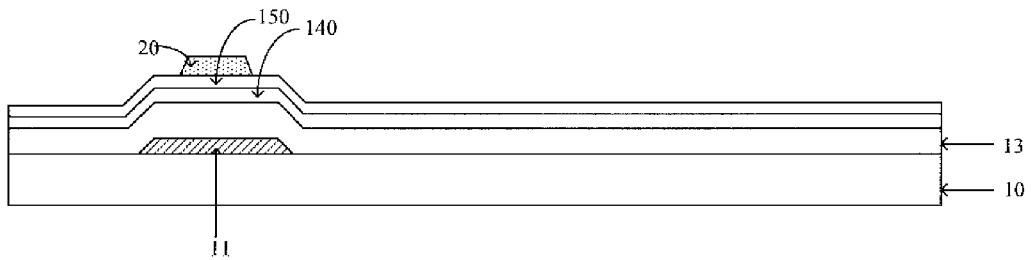
FIG. 5 is a third schematic view of the array substrate provided in the second embodiment of the present invention.

Exemplarily, as shown in FIG. 5, after a first photoresist is coated on the etching barrier layer film 150, a first photoresist 20 remained on a TFT channel region is obtained as shown in FIG. 5 after exposure, development treatment by mask, no photoresist on other regions. Then, as shown in FIG. 6, the etching barrier layer film 150 which is not covered by the first photoresist 20 is etched by etching process, only the etching barrier layer film in the region that is covered by the first photoresist 20 (namely, TFT channel region) is remained after treatment, so that an etching barrier layer 15 which covers the TFT channel region is formed, and the metal oxide film 140 not covered by the etching barrier layer 15 is exposed.

S204, subjecting the metal oxide film 140 not covered by the etching barrier layer 15 to metallization treatment, to form a metal oxide film having conductor properties, wherein a semiconductor active layer is formed from a portion of the metal oxide film 140 that is covered by the etching barrier layer 15 and is not subjected to the metallization treatment.

Figure 7:
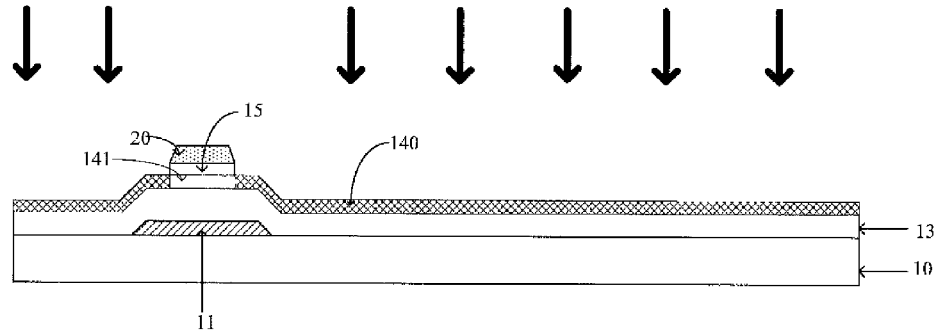
FIG. 7 is a fifth schematic view of the array substrate provided in the second embodiment of the present invention.

Exemplarily, as shown in FIG. 7, the exposed metal oxide film 140 may be subjected to a metallization treatment by plasma process or annealing process and the like. The step can be realized through the following three manners.

Figure 6:
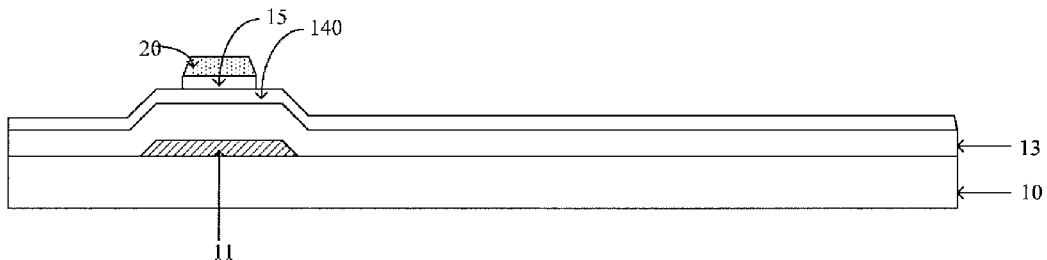
FIG. 6 is a fourth schematic view of the array substrate provided in the second embodiment of the present invention.

Manner 1: the substrate having the structure shown in FIG. 6 is disposed in a vacuum chamber and heated to a certain temperature for a certain period and then cooled in air. For example, the certain temperature may be 200~300° C., the maintaining period may be 20~40 minutes.

Manner 2: the substrate having the structure shown in FIG. 6 is subject to heat treatment at 200~400° C. under reduction atmosphere.

Manner 3: the substrate having the structure shown in FIG. 6 is disposed in a vacuum chamber, a plasma treatment method is used, with a general power of 1500~2500 W, pressure of 1000~2000 mtorr, there are two methods as hydrogen ($H_2$) plasma and oxygen ($O_2$) plasma treatment, when hydrogen plasma or oxygen plasma treatment is used, a gas flow rate of hydrogen or oxygen is generally 5000~15000 sccm.

By the above-mentioned three manners, a carrier concentration of the metal oxide film 140 being subjected to metallization treatment can be improved, presenting conductor properties. The metal oxide film 140 being subjected to metallization treatment can be used to replace the existing pixel electrode materials. Nevertheless, a carrier concentration of the metal oxide film under the etching barrier layer 15 not being subjected to metallization treatment is low, presenting semiconductor properties, namely the semiconductor active layer 141.

S205, treating the metal oxide film having conductor properties by patterning process to form a first transparent electrode, and a source connecting electrode, a drain connecting electrode connected to the semiconductor active layer.

Figure 8:
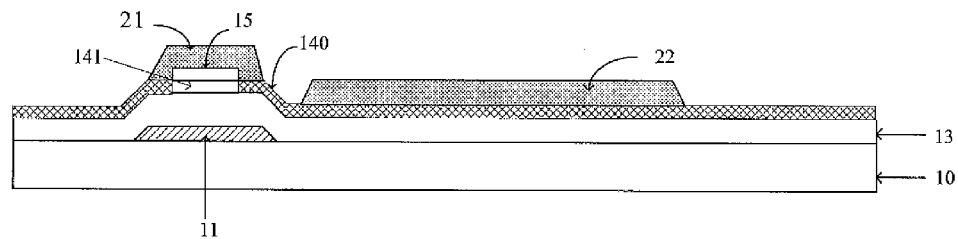
FIG. 8 is a sixth schematic view of the array substrate provided in the second embodiment of the present invention.
Figure 9:
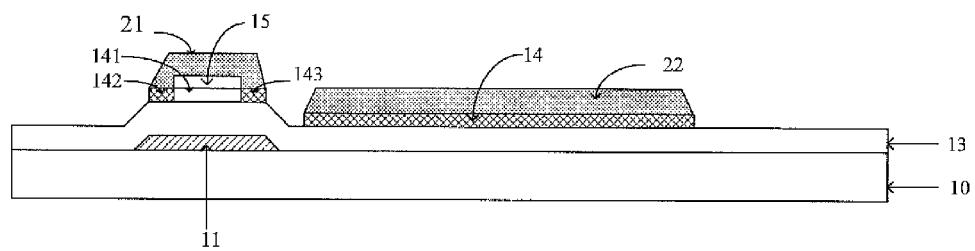
FIG. 9 is a seventh schematic view of the array substrate provided in the second embodiment of the present invention.

Exemplarily, after the first photoresist 20 covering the etching barrier layer 15 as shown in FIG. 7 is stripped, a second photoresist layer is further coated on the substrate 10, after exposure, development treatment by mask, as shown in FIG. 8, a second photoresist 21 remained on the etching barrier layer 15 and both sides thereof, and a third photoresist 22 corresponding to the first transparent electrode region remained on the metal oxide film 140 having conductor properties are obtained, no photoresist on other regions. Then, as shown in FIG. 9, the exposed metal oxide film having conductor properties is subjected to etching by etching process, to form a first transparent electrode 14, and a source connecting electrode 142, a drain connecting electrode 143 connected to the semiconductor active layer 141, finally, the second photoresist 21, the third photoresist 22 as shown in FIG. 9 are stripped out.

S206, sequentially forming patterns for a source electrode, a drain electrode, a data line, a passivation layer and a second transparent electrode on the substrate having the semiconductor active layer, the etching barrier layer and the first transparent electrode formed thereon.

It is noted that in the present embodiment, the first transparent electrode 14 is exemplified as a pixel electrode (namely, it is electrically connected to the drain electrode) for illustration, however, the present embodiment does not limit to the case in which the first transparent electrode 14 must be a pixel electrode, the firstly transparent electrode 14 can also be a common electrode.

The source and drain electrodes, the data line, the passivation layer and the second transparent electrode in the present step can be formed by three patterning processes, respectively.

Figure 10:
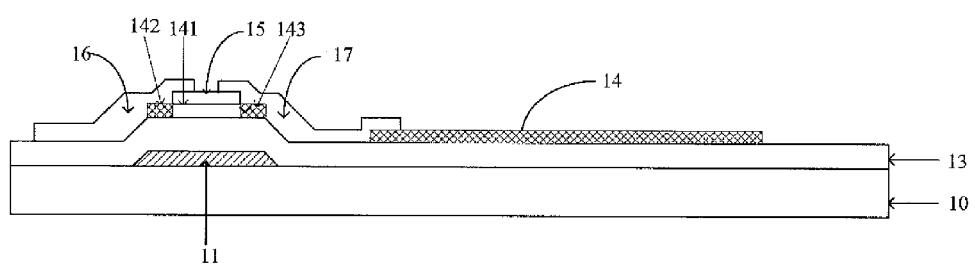
FIG. 10 is an eighth schematic view of the array substrate provided in the second embodiment of the present invention.

Referring to FIG. 10, a metal film is fanned on the substrate 10 using the existing film forming method such as magnetron sputtering or thermal evaporation and the like, and patterns for the source electrode 16 electrically connected to the source connecting electrode 142, the drain electrode 17 electrically connected to the drain connecting electrode 143 and the data line (not shown in FIG. 10) are formed by patterning process. Herein, the metal film for forming the source and drain electrodes and the data line may be a single film formed of metals such as molybdenum, aluminum, aluminum rubidium alloy, tungsten, chromium, copper etc., or it may be a multi-layered film formed by the multi-layered deposition of the above metals.

Figure 11:
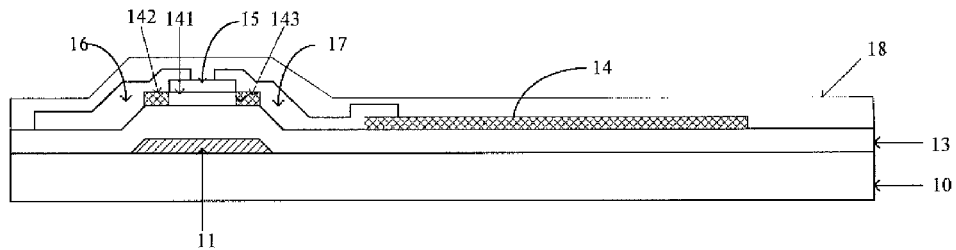
FIG. 11 is a ninth schematic view of the array substrate provided in the second embodiment of the present invention.

Then, as shown in FIG. 11, a passivation layer 18 formed of insulating film is further prepared on the substrate 10 by method such as chemical vapor deposition or thermal evaporation and the like. Wherein, the insulating film maybe a single film using silicon nitride, silicon oxide or silicon oxynitride, or it may be a multi-layered film using the multi-layered deposition of the above materials.

Figure 12:
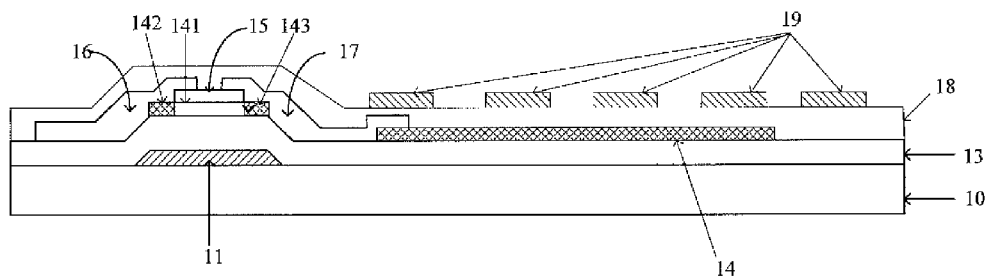
FIG. 12 is a cross-section schematic structural view of the array substrate provided in the second embodiment of the present invention.

Finally, as shown in FIG. 12, a transparent conductive film is formed by method such as magnetron sputtering or thermal evaporation and the like, and a second transparent electrode 19 having slit is formed by patterning process. A multi-dimensional electric field may be formed between the first transparent electrode 14 and the second transparent electrode 19. Wherein, the material for the second transparent electrode 19 may be transparent conductive materials such as ITO, ZnO, InGaZnO, InZnO, InGaO and the like.

In the method for fabricating an array substrate provided in the present embodiment, a portion of the metal oxide film is subject to metallization treatment to present conductor properties to form a first transparent electrode, a portion which is not subjected to metallization treatment presents semiconductor properties to form semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost.

Moreover, since the metal oxide semiconductor materials are easily oxidized in water or in the air, the metal oxide semiconductor materials of the TFT channel region are easily damaged during wet etching in the subsequent processes, resulting in poor TFT properties. In the present example, a region corresponding to the TFT channel is covered by the etching barrier layer, the metal oxide semiconductor materials of the TFT channel region may be prevent from being damaged during etching by the protection of the etching barrier layer, so as to ensure the TFT properties, and thus ensure the display quality of the product.

Third Embodiment

The basic course for the method for fabricating an array substrate provided in the present embodiment is similar to the second embodiment, and can refer to the second embodiment.

Figure 13:
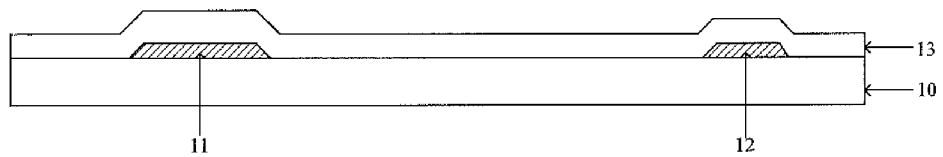
FIG. 13 is a first schematic view of an array substrate provided in a third embodiment of the present invention.

The present embodiment differs from the second embodiment in that, instead of S201 of the second embodiment, S201' of the present embodiment comprises: as shown in FIG. 13, while a gate line (not shown in FIG. 13), a gate electrode 11 are formed on the substrate 10, a common electrode line 12 is also formed, thereafter, a gate insulating layer 13 is further formed on the substrate 10.

Further, the common electrode line 12 and the gate electrode 11 and the gate line can be formed by one patterning process.

The steps after forming the gate line, the gate electrode and the common electrode line are the same as steps S202-S205 in the second embodiment, and will not be described any more.

Figure 14:
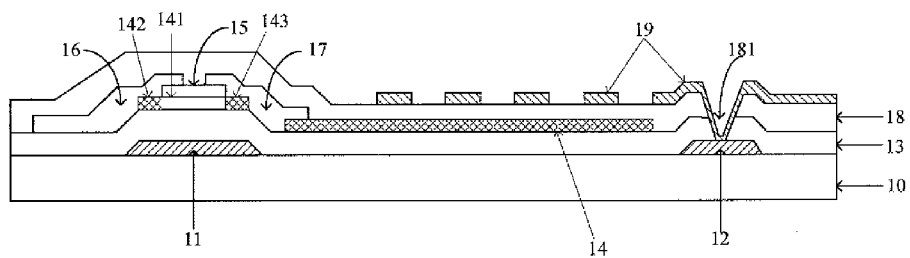
FIG. 14 is a cross-section schematic structural view of the array substrate provided in the third embodiment of the present invention.

The patterns for the source electrode, the drain electrode, the data line, the passivation layer and the second transparent electrode are formed on the substrate having the semiconductor active layer, the etching barrier layer and the first transparent electrode formed thereon, instead of S206 in the second embodiment, S206' of the present example includes: referring to FIG. 14, a source electrode 16, a drain electrode 17 electrically connected to the first transparent electrode 14, and the data line are sequentially formed on the substrate having the semiconductor active layer 141, the etching barrier layer 15 and the first transparent electrode 14 formed thereon. Then a passavation layer 18 comprising a first through hole 181 is formed on the substrate having the data line, the source electrode 16 and the drain electrode 17 formed thereon, the first through hole 181 passes through the passivation layer 18 and the gate insulating layer 13, exposing the common electrode lines 12. Then, a second transparent electrode 19 is further formed on the passivation layer 18, the second transparent electrode 19 is electrically connected to the common electrode lines 12 via the first through hole 181, the second transparent electrode 19 is a transparent electrode having slit, a multi-dimensional electric field is formed by the first transparent electrode 14 and the second transparent electrode 19 having slit.

Accordingly, in the present embodiment, the first transparent electrode 14 is a pixel electrode, and directly contacts with the drain electrode 17 to achieve electrical connection; the second transparent electrode 17 is a common electrode, and electrically connected with the common electrode lines 12 via the first through hole 181.

In the method for fabricating an array substrate provided in the present embodiment, a portion of the metal oxide film is subjected to metallization treatment to present conductor properties so as to form the first transparent electrode, a portion which is not subjected to metallization treatment presents semiconductor properties to form semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost. Meanwhile, the common electrode and the common electrode lines are electrically connected, which may greatly reduce the resistance of the common electrode. As the size of the panel increases, the resistance of the common electrode may result in the problems as picture retard or display abnormality etc. The above problem can be thoroughly solved by the directly electrical connection between the common electrode and the common electrode line via the above first through hole.

Moreover, since the metal oxide semiconductor materials are easily oxidized in water or in the air, the metal oxide semiconductor materials of the TFT channel region are easily damaged during wet etching in the subsequent processes, resulting in poor TFT properties. In the present example, a region corresponding to the TFT channel is covered by the etching barrier layer, the metal oxide semiconductor materials of the TFT channel region may be prevent from being damaged during etching by the protection of the etching barrier layer, so as to ensure the TFT properties, and thus ensure the display quality of the product.

Fourth Embodiment

The basic course for the method for fabricating an array substrate provided in the present embodiment is similar to the second embodiment, and can refer to the second embodiment.

Figure 15:
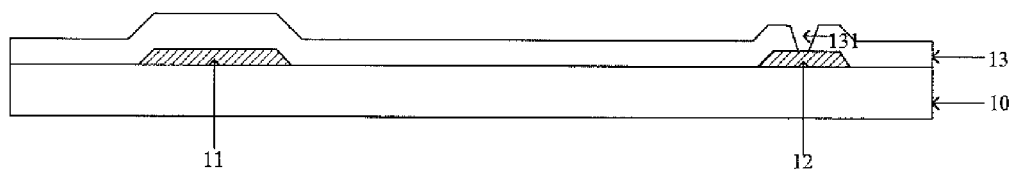
FIG. 15 is a first schematic view of an array substrate provided in a fourth embodiment of the present invention.

The present embodiment differs from the second embodiment in that, instead of S201 of the second embodiment, S201" of the present embodiment comprises: as shown in FIG. 15, a gate line (not shown in FIG. 15), a gate electrode 11 and a common electrode line 12, as well as a gate insulating layer 13 are formed on the substrate 10. Thereafter, a second through hole 131 is formed on the gate insulating layer 13, the second through hole 131 exposes the common electrode lines 12, for connecting the first transparent electrode 14 and the common electrode lines 12 formed in the subsequent processes.

Figure 16:
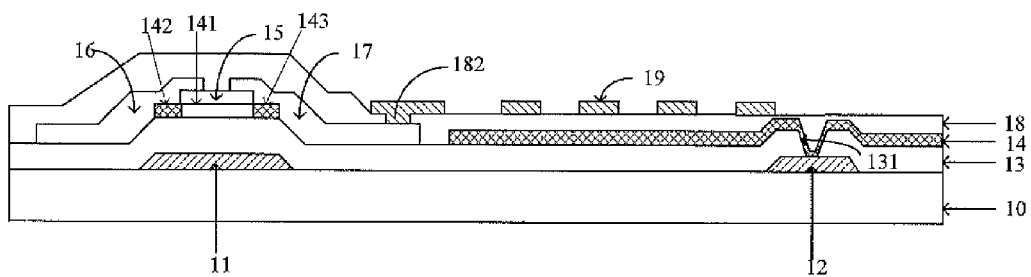
FIG. 16 is a cross-section schematic structural view of the array substrate provided in the fourth embodiment of the present invention.

The following steps are similar to steps S202-S204 in the second embodiment, referring to FIG. 16, the first transparent electrode 14 is connected to the common electrode lines 12 via the second through hole 131 in the embodiment.

Instead of step S205 in the second embodiment, step S205" in the present embodiment comprises: referring to FIG. 16, the thus formed metal oxide film having conductor properties is treated by patterning process to form a first transparent electrode 14, and a source connecting electrode 142, a drain connecting electrode 143 connected to the semiconductor active layer 141. Wherein, the first transparent electrode 14 is electrically connected to the common electrode lines 12 via the second through hole 131.

Instead of S206 in the second embodiment, S206" of the present embodiment includes: referring to FIG. 16, a source electrode 16, a drain electrode 17, and a data line (not shown in FIG. 16) are sequentially formed on the substrate 10 having the semiconductor active layer 141, the etching barrier layer 15 and the first transparent electrode 14' formed thereon, then a passavation layer 18 comprising a third through hole 182 is formed thereon, the third through hole 182 passes through the passivation layer 18, exposing the drain electrode 17. Then, a second transparent electrode 19 is formed on the passivation layer 18 having the third through hole 182 formed thereon, the second transparent electrode 19 is electrically connected to the drain electrode 17 via the third through hole 182.

Accordingly, in the present embodiment, the first transparent electrode 14 is a common electrode, and electrically connected to the common electrode lines 12 via the second through hole 131 on the gate insulating layer 13. The second transparent electrode 19 is a pixel electrode, and is electrically connected to the drain electrode 17 via the third through hole 182 on the passivation layer 18.

In the method for fabricating an array substrate provided in the present embodiment, a portion of the metal oxide film is subjected to metallization treatment to present conductor properties so as to form the first transparent electrode, a portion which is not subjected to metallization treatment presents semiconductor properties to form semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost. Meanwhile, the common electrode and the common electrode lines are electrically connected, which may greatly reduce the resistance of the common electrode. As the size of the panel increases, the resistance of the common electrode may result in the problems as picture retard or display abnormality etc. The above problem can be thoroughly solved by the directly electrically connection between the common electrode and the common electrode lines via the above first through hole.

Moreover, since the metal oxide semiconductor materials are easily oxidized in water or in the air, the metal oxide semiconductor materials of the TFT channel region are easily damaged during wet etching in the subsequent processes, resulting in poor TFT properties. In the present embodiment, a region corresponding to the TFT channel is covered by the etching barrier layer, the metal oxide semiconductor materials of the TFT channel region may be prevent from being damaged during etching by the protection of the etching barrier layer, so as to ensure the TFT properties, and thus ensure the display quality of the product.

Fifth Embodiment

The array substrate fabricated from the methods for fabricating the array substrate illustrated by the above examples provided in the present embodiment comprises a thin film transistor, a first transparent electrode and a second transparent electrode, a multi-dimensional electric field is created by the first transparent electrode and the second transparent electrode. The semiconductor active layer of the thin film transistor and the first transparent electrode are formed by the same layer of metal oxide film through one patterning process, wherein the first transparent electrode is obtained by subjecting the metal oxide film to metallization treatment, and the semiconductor active layer is formed from the metal oxide film which is not subjected to metallization treatment.

It is noted that, the above embodiments are illustrated by taking an array substrate having the pixel electrode and the common electrode disposed in different layers. It is appreciated that in the above embodiments, when the pixel electrode and the common electrode are disposed in the same layer of the array substrate, patterns for the active layer, the pixel electrode and the common electrode may also be formed on a metal oxide film by patterning process, metallization treatment and etc. Accordingly, the array substrate provided in the embodiments of the present invention is also applicable to IPS (In-plane switch) type and AD-SDS type array substrates after proper variation.

In the array substrate provided in the present embodiment, a portion of the metal oxide film is subjected to metallization treatment to present conductor properties so as to form the first transparent electrode, a portion which is not subjected to metallization treatment presents semiconductor properties to form semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost.

Sixth Embodiment

A display device provided in the present embodiment comprises the array substrate described in the fifth embodiment, the array substrate is fabricated by any one of the fabricating method for an array substrate of the first to fourth embodiments. The array substrate comprises a thin film transistor, a first transparent electrode and a second transparent electrode, a multi dimensional electric field is created by the first transparent electrode and the second transparent electrode, the semiconductor active layer and the first transparent electrode are formed by the same layer of metal oxide film having both conductor properties and semiconductor properties through one patterning process, wherein, the first transparent electrode is obtained by subjecting the metal oxide film to metallization treatment, and the semiconductor active layer is formed by the metal oxide film which is not subjected to metallization treatment.

In the display device provided in the present embodiment, a portion of the metal oxide film is subjected to metallization treatment to present conductor properties so as to form the first transparent electrode on its array substrate, a portion which is not subjected to metallization treatment presents semiconductor properties to form semiconductor active layer. The semiconductor active layer and the first transparent electrode are formed in the same layer of metal oxide film having both conductor properties and semiconductor properties through one patterning process, which omits a step for separately preparing the first transparent electrode, and reduces the producing cost.

It is noted that the display device provided in the embodiment of the present invention may be: any products or components having display function such as liquid crystal panel, E-paper, OLED panel, liquid crystal television, liquid crystal display, digital frame, mobile phone, flat panel computer, and the like.

The foregoing are merely exemplary embodiments of the invention, but are not used to limit the protection scope of the invention. The protection scope of the invention shall be defined by the attached claims.

What is claimed is:

1. A method for fabricating an array substrate, comprising forming a thin film transistor, a first transparent electrode and a second transparent electrode, wherein a multi dimensional electric field is created by the first transparent electrode and the second transparent electrode, wherein, forming the first transparent electrode comprises:

forming a metal oxide film presenting semiconductor properties;

forming the first transparent electrode by subjecting a portion of the metal oxide film to metallization treatment, and forming a semiconductor active layer from a portion which is not subjected to the metallization treatment, wherein forming the thin film transistor, the first transparent electrode and the second transparent electrode comprises:

sequentially forming the metal oxide film and an etching barrier layer film on the substrate having a gate line, a gate electrode and a gate insulating layer formed thereon;

forming an etching barrier layer covering a TFT channel region by treating the etching barrier layer film with patterning process;

subjecting the metal oxide film not covered by the etching barrier layer to metallization treatment, to form a metal oxide film having conductor properties; forming the semiconductor active layer from the portion of the metal oxide film that is covered by the etching barrier layer and is not subjected to the metallization treatment;

after the metallization treatment, forming the first transparent electrode and a source connecting electrode, a drain connecting electrode connected to the semiconductor active layer by etching the metal oxide film having conductor properties with a photoresist pattern thereon as a mask;

forming a source electrode, a drain electrode, a data line, a passivation layer and the second transparent electrode on the substrate having the semiconductor active layer, the etching barrier layer and the first transparent electrode formed thereon, wherein the source electrode is electrically connected to the source connecting electrode, and the drain electrode is electrically connected to the drain connecting electrode, wherein, the method further comprises forming the gate line, the gate electrode and a common electrode line on the substrate and forming a gate insulating layer on the substrate, the gate line, the gate electrode and the common electrode line, prior to sequentially forming the metal oxide film and the etching barrier layer film on the substrate having the gate line, the gate electrode and the gate insulating layer formed thereon;

forming the source electrode, the drain electrode, the data line, the passivation layer and the second transparent electrode on the substrate having the semiconductor active layer, the etching barrier layer and the first transparent electrode formed thereon comprises: forming the data line, the source electrode, and the drain electrode electrically connected to the first transparent electrode on the substrate having the semiconductor active layer, the etching barrier layer and the first transparent electrode formed thereon, forming the passivation layer containing a first through hole, the first through hole passing through the passivation layer and the gate insulating layer so as to expose the common electrode line; and forming the second transparent electrode on the passivation layer, the second transparent electrode being electrically connected to the common electrode line via the first through hole.

2. The method of claim 1, wherein forming the first transparent electrode by subjecting a portion of the metal oxide film to metallization treatment comprises:

forming the first transparent electrode by subjecting a portion of the metal oxide film to metallization treatment by plasma process or annealing process.

3. The method of claim 2, wherein the first transparent electrode is a pixel electrode or a common electrode.

4. The method of claim 1, wherein the metal oxide film is a transparent metal oxide material presenting semiconductor properties.

5. The method of claim 4, wherein the metal oxide material is InGaZnO, InGaO, ITZO, AlZnO.

6. An array substrate, fabricated by the method of claim 1.

7. A method for fabricating an array substrate, comprising forming a thin film transistor, a first transparent electrode and a second transparent electrode, wherein a multi dimensional electric field is created by the first transparent electrode and the second transparent electrode, wherein, forming the first transparent electrode comprises:

forming a metal oxide film presenting semiconductor properties;

forming the first transparent electrode by subjecting a portion of the metal oxide film to metallization treatment, and forming a semiconductor active layer from a portion which is not subjected to the metallization treatment, wherein forming the thin film transistor, the first transparent electrode and the second transparent electrode comprises:

sequentially forming the metal oxide film and an etching barrier layer film on the substrate having a gate line, a gate electrode and a gate insulating layer formed thereon;

forming an etching barrier layer covering a TFT channel region by treating the etching barrier layer film with patterning process;

subjecting the metal oxide film not covered by the etching barrier layer to metallization treatment, to form a metal oxide film having conductor properties; forming the semiconductor active layer from the portion of the metal oxide film that is covered by the etching barrier layer and is not subjected to the metallization treatment;

after the metallization treatment forming the first transparent electrode and a source connecting electrode, a drain connecting electrode connected to the semiconductor active layer by etching the metal oxide film having conductor properties with patterning process a photoresist pattern thereon as a mask;

forming a source electrode, a drain electrode, a data line, a passivation layer and the second transparent electrode on the substrate having the semiconductor active layer, the etching barrier layer and the first transparent electrode formed thereon, wherein the source electrode is electrically connected to the source connecting electrode, and the drain electrode is electrically connected to the drain connecting electrode, wherein, the method further comprises forming the gate line, the gate electrode, a common electrode line and a gate insulating layer on the substrate, and forming a second through hole on the gate insulating layer for connecting the first transparent electrode with the common electrode line, prior to sequentially forming the metal oxide film and the etching barrier layer film on the substrate having the gate line, the gate electrode and the gate insulating layer formed thereon;

forming the source electrode, the drain electrode, the data line, the passivation layer and the second transparent electrode on the substrate having the semiconductor active layer, the etching barrier layer and the first transparent electrode formed thereon comprises: forming the source electrode, the drain electrode, and the data line on the substrate having the semiconductor active layer, the etching barrier layer and the first transparent electrode formed thereon; forming the passivation layer containing a third through hole, the third through hole passing through the passivation layer so as to expose the drain electrode; and forming the second transparent electrode on the passivation layer, the second transparent electrode being electrically connected to the drain electrode via the third through hole.

8. The method of claim 7, wherein forming the first transparent electrode by subjecting a portion of the metal oxide film to metallization treatment comprises:

forming the first transparent electrode by subjecting a portion of the metal oxide film to metallization treatment by plasma process or annealing process.

9. The method of claim 8, wherein the first transparent electrode is a pixel electrode or a common electrode.

10. The method of claim 7, wherein the metal oxide film is a transparent metal oxide material presenting semiconductor properties.

11. The method of claim 10, wherein the metal oxide material is InGaZnO, InGaO, ITZO, AlZnO.

* * * * *